(12) United States Patent
Tadayoni et al.

(10) Patent No.: US 9,018,690 B2
(45) Date of Patent: Apr. 28, 2015

(54) SPLIT-GATE MEMORY CELL WITH SUBSTRATE STRESSOR REGION, AND METHOD OF MAKING SAME

(71) Applicants: Mandana Tadayoni, Cupertino, CA (US); Nhan Do, Saratoga, CA (US)

(72) Inventors: Mandana Tadayoni, Cupertino, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 13/631,490

(22) Filed: Sep. 28, 2012

(65) Prior Publication Data

US 2014/0091382 A1    Apr. 3, 2014

(51) Int. Cl.
| | |
|---|---|
| *H01L 29/788* | (2006.01) |
| *H01L 29/423* | (2006.01) |
| *H01L 29/778* | (2006.01) |
| *H01L 21/28* | (2006.01) |
| *H01L 27/115* | (2006.01) |

(52) U.S. Cl.
CPC ........ *H01L 29/788* (2013.01); *H01L 29/42324* (2013.01); *H01L 29/42328* (2013.01); *H01L 29/7781* (2013.01); *H01L 21/28273* (2013.01); *H01L 27/11521* (2013.01)

(58) Field of Classification Search
CPC ............ H01L 21/28273; H01L 29/788; H01L 27/11521; H01L 29/66825; H01L 29/7883; H01L 29/78; H01L 29/66636

USPC ...................... 257/315–317, 319–320, E29.3, 257/E29.129; 438/201, 211, 257
See application file for complete search history.

(56) References Cited

U.S. PATENT DOCUMENTS

| | | | |
|---|---|---|---|
| 5,029,130 A | 7/1991 | Yeh | |
| 6,747,310 B2 | 6/2004 | Fan et al. | |
| 7,315,056 B2 * | 1/2008 | Klinger et al. | 257/315 |
| 7,868,375 B2 | 1/2011 | Liu et al. | |
| 7,927,994 B1 | 4/2011 | Liu et al. | |
| 2005/0276117 A1 * | 12/2005 | Forbes | 365/185.28 |
| 2007/0281413 A1 | 12/2007 | Li et al. | |
| 2008/0006818 A1 * | 1/2008 | Luo et al. | 257/19 |
| 2011/0127599 A1 * | 6/2011 | Liu et al. | 257/319 |
| 2012/0181549 A1 * | 7/2012 | Johnson et al. | 257/77 |

OTHER PUBLICATIONS

PCT Search Report dated Dec. 19, 2013 corresponding to the related PCT Application No. US13/52846.

* cited by examiner

*Primary Examiner* — Theresa T Doan
(74) *Attorney, Agent, or Firm* — DLA Piper LLP (US)

(57) ABSTRACT

A memory device, and method of make same, having a substrate of semiconductor material of a first conductivity type, first and second spaced-apart regions in the substrate of a second conductivity type, with a channel region in the substrate therebetween, a conductive floating gate over and insulated from the substrate, wherein the floating gate is disposed at least partially over the first region and a first portion of the channel region, a conductive second gate laterally adjacent to and insulated from the floating gate, wherein the second gate is disposed at least partially over and insulated from a second portion of the channel region, and a stressor region of embedded silicon carbide formed in the substrate underneath the second gate.

5 Claims, 10 Drawing Sheets

SPLIT-GATE MEMORY CELL WITH SUBSTRATE STRESSOR REGION, AND METHOD OF MAKING SAME

FIELD OF THE INVENTION

The present invention relates to split-gate, non-volatile Flash memory cells and methods of making the same, and more particularly memory cells having a stressor region in the substrate under the word line gate.

BACKGROUND OF THE INVENTION

Split gate non-volatile Flash memory cells having a select gate, a floating gate, a control gate and an erase gate are well known in the art. See for example U.S. Pat. Nos. 6,747,310, 7,868,375 and 7,927,994, and published application 2011/0127599, which are all incorporated herein by reference in their entirety for all purposes. Such split gate memory cells include a channel region in the substrate that extends between the source and drain. The channel region has a first portion underneath the floating gate (hereinafter called the FG channel, the conductivity of which is controlled by the floating gate), and a second portion underneath the select gate (hereinafter the "WL channel" (wordline), the conductivity of which is controlled by the select gate).

In order to increase performance and reduce operating voltages for read, program and erase, various insulation and other thicknesses can be optimized. However, there is a need for further cell optimization not achievable by cell geometry optimization alone.

BRIEF SUMMARY OF THE INVENTION

Superior cell optimization has been achieved in a memory device having a substrate of semiconductor material of a first conductivity type, first and second spaced-apart regions in the substrate of a second conductivity type, with a channel region in the substrate therebetween, a conductive floating gate over and insulated from the substrate, wherein the floating gate is disposed at least partially over the first region and a first portion of the channel region, a conductive second gate laterally adjacent to and insulated from the floating gate, wherein the second gate is disposed at least partially over and insulated from a second portion of the channel region, and a stressor region of embedded silicon carbide formed in the substrate underneath the second gate.

A method of forming a memory device includes providing a substrate of semiconductor material of a first conductivity type, forming first and second spaced-apart regions in the substrate of a second conductivity type, with a channel region in the substrate therebetween, wherein the channel region has first and second portions, forming a stressor region of embedded silicon carbide in the substrate, forming a conductive floating gate over and insulated from the substrate, wherein the floating gate is disposed at least partially over the first region and the first portion of the channel region, and forming a conductive second gate laterally adjacent to and insulated from the floating gate, wherein the second gate is disposed at least partially over and insulated from the second portion of the channel region and over the stressor region.

Other objects and features of the present invention will become apparent by a review of the specification, claims and appended figures.

DETAILED DESCRIPTION OF THE INVENTION

Figure 1:
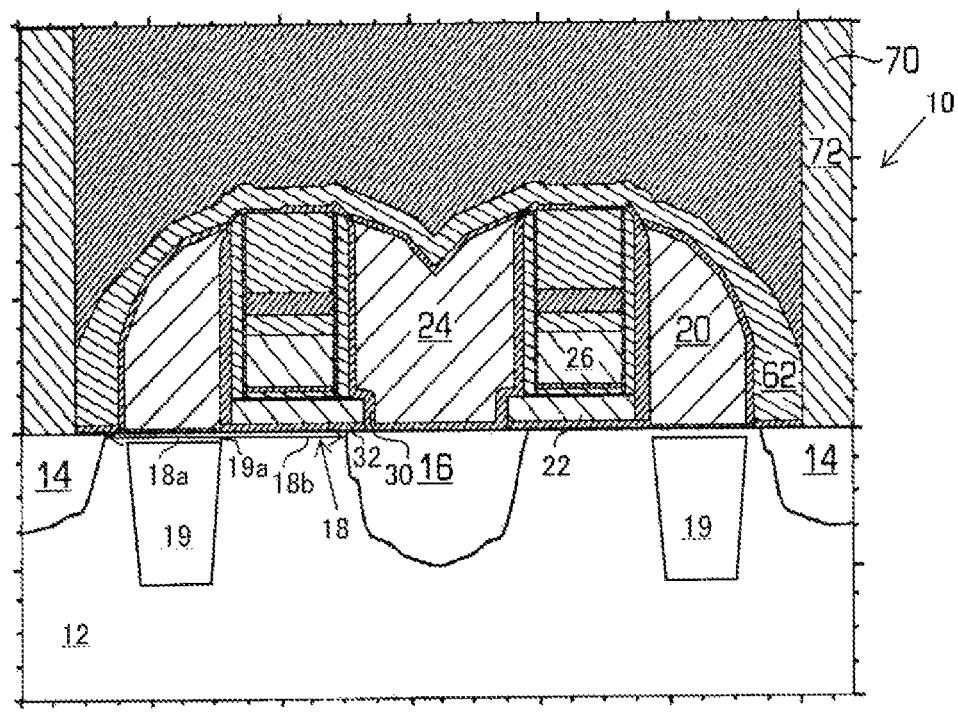
FIG. 1 is a side cross sectional view of a four gate memory cell with the stressor region of the present invention.

FIG. 1 illustrates a cross-sectional view of a non-volatile memory cell 10 of the present invention. While the memory cell 10 of FIG. 1 is exemplary of the type that can benefit from the techniques of the present invention, it is only one example and should not be deemed to be limiting. The memory cell 10 is made in a substantially single crystalline substrate 12, such as single crystalline silicon, of a first conductivity type (e.g. P conductivity type). Within the substrate 12 is a region 14 of a second conductivity type. If the first conductivity type is P then the second conductivity type is N. Spaced apart from region 14 is another region 16 of the second conductivity type. Between the regions 14 and 16 is a channel region 18 which comprises the WL channel 18a and the FG channel 18b, and which provides for the conduction of charges between region 14 and region 16.

Positioned above, and spaced apart and insulated from the substrate 12 is a select gate 20, also known as the word line 20. The select gate 20 is positioned over a first portion of the channel region 18 (i.e. the WL channel portion 18a). The WL channel portion 18a of the channel region 18 immediately abuts the region 14. Thus, the select gate 20 has little or no overlap with the region 14. A floating gate 22 is also positioned above and is spaced apart and is insulated from the substrate 12. The floating gate 22 is positioned over a second portion of the channel region 18 (i.e. the FG channel portion 18b) and a portion of the region 16. The FG channel portion 18b of the channel region 18 is distinct from the WL channel portion 18a of the channel region 18. Thus, the floating gate 22 is laterally spaced apart and is insulated from and is adjacent to the select gate 20. An erase gate 24 is positioned over and spaced apart from the region 16, and is insulated from the substrate 12. The erase gate 24 is laterally insulated and spaced apart from the floating gate 22. The select gate 20 is to one side of the floating gate 22, with the erase gate 24 to another side of the floating gate 22. Finally, positioned above the floating gate 22 and insulated and spaced apart therefrom is a control gate 26. The control gate 26 is positioned between and insulated from the erase gate 24 and the select gate 20.

The WL channel 18a includes a stressor region 19 of embedded silicon carbide in the substrate 12 underneath the select gate 20. The stressor region 19 induces a tensile strain in the WL channel 18a in the form of a strained silicon layer 19a above stressor region 19. The stressor region 19 and strained silicon layer 19a enhances electron mobility, which in turn allows for a higher threshold voltage (Vt) to be used to reduce the off read current (Ioff) while maintaining a target read current (Iread). In addition, with its wide bandgap, the silicon carbide stressor region 19 introduces an energy barrier against electron transport, which further reduces Ioff.

The present invention is important as cell size is scaled down. Specifically, as the length of the WL channel portion 18a becomes shorter, and the word line threshold voltage (Vtwl) is optimized for the desired cell current, the leakage during the read operation can increase as much as four times. Table 1 below illustrates the changes in operational performance parameters of the memory cell 10 (without the presence of stressor region 19) when the word line critical dimension is scaled from 0.15 μm to 0.11 μm.

TABLE 1

|  | Memory cell 10 (without stressor 19) WL CD = 0.15 μm | Memory cell 10 (without stressor 19) WL CD = 0.11 μm |
|---|---|---|
| WL tox | 32 Å | 22 Å |
| Iread | ≈30 μA Vwl = Vcg = 1.8 V, Vbl = 0.6 V, Vsl = 0 V | ≈22 μA Vwl = Vcg = 1.2 V, Vbl = 0.6 V, Vsl = 0 V |
| Ioff | ≈55 nA/kbit | ≈226 nA/Kbit |
| Vt | 0.42 V | 0.37 V |

The smaller memory cell dimensions result in the off read current (Ioff) quadrupling, along with Vt dropping over ten percent.

However, Table 2 below illustrates the operation performance parameters of memory cell 10 with a 0.11 μm word line critical dimension, without and then with stressor region 19.

TABLE 2

|  | Memory cell 10 (without stressor 19) WL CD = 0.11 μm | Memory cell 10 (with stressor 19) WL CD = 0.11 μm |
|---|---|---|
| WL tox | 22 Å | 22 Å |
| Iread | ≈22 μA Vwl = Vcg = 1.2 V Vbl = 0.6 V, Vsl = 0 V | ≈22.5 μA Vwl = Vcg = 1.2 V Vbl~0.6 V, Vsl = 0 V |
| Ioff | ≈226 nA/Kbit | ≈57 nA/Kbit |
| Vt | 0.37 V | 0.52 V |

The inclusion of stressor region 19 results in dropping the off read current (Ioff) to essentially that of a 0.15 μm memory cell (i.e. a 4 factor drop), while maintaining a high read current (Iread), and a high voltage Vt. Therefore, stressor region 19 significantly enhances the performance of the memory cell 10 (allows for higher Vt to be used to reduce Ioff while maintaining the target Iread, and reduces Ioff further by introducing an energy barrier against electron transport).

Figure 2A:
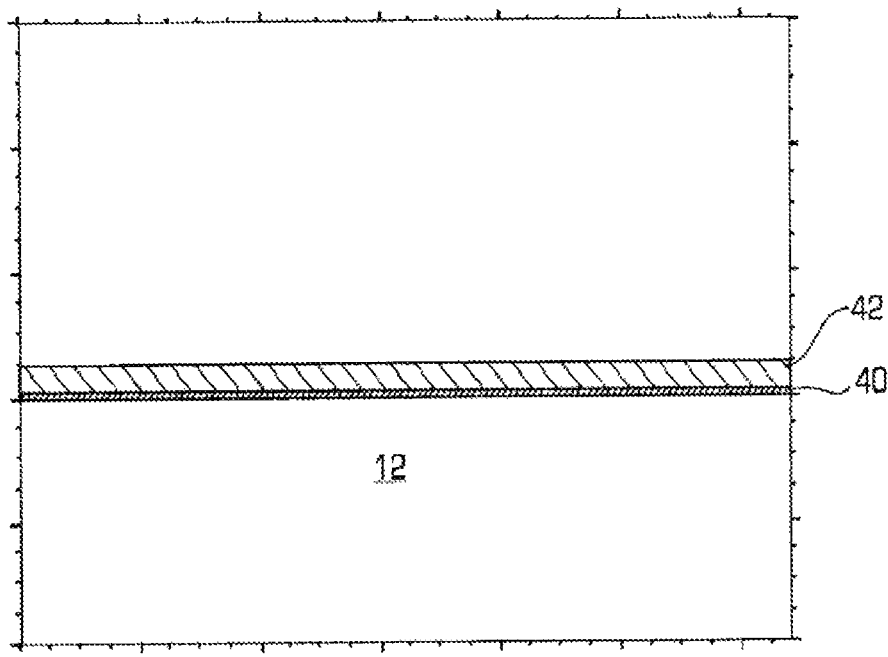
FIGS. 2A to 2M are side cross sectional views illustrating the steps in the process to make a non-volatile memory cell according the present invention.

FIGS. 2A-2M illustrate cross-sectional views of the steps in the process to make a 4-gate non-volatile memory cell 10. Commencing with FIG. 2A, a layer of silicon dioxide 40 is formed on substrate 12 (e.g. P type single crystalline silicon). For 90-120 nm processes, the layer 40 of silicon dioxide can be on the order of 80-100 angstroms. Thereafter a first layer 42 of polysilicon (or amorphous silicon) is deposited or formed on the layer 40 of silicon dioxide. The first layer 42 of polysilicon can be on the order of 300-800 angstroms. The first layer 42 of polysilicon is subsequently patterned in a direction perpendicular to the select gate 20.

Figure 2B:
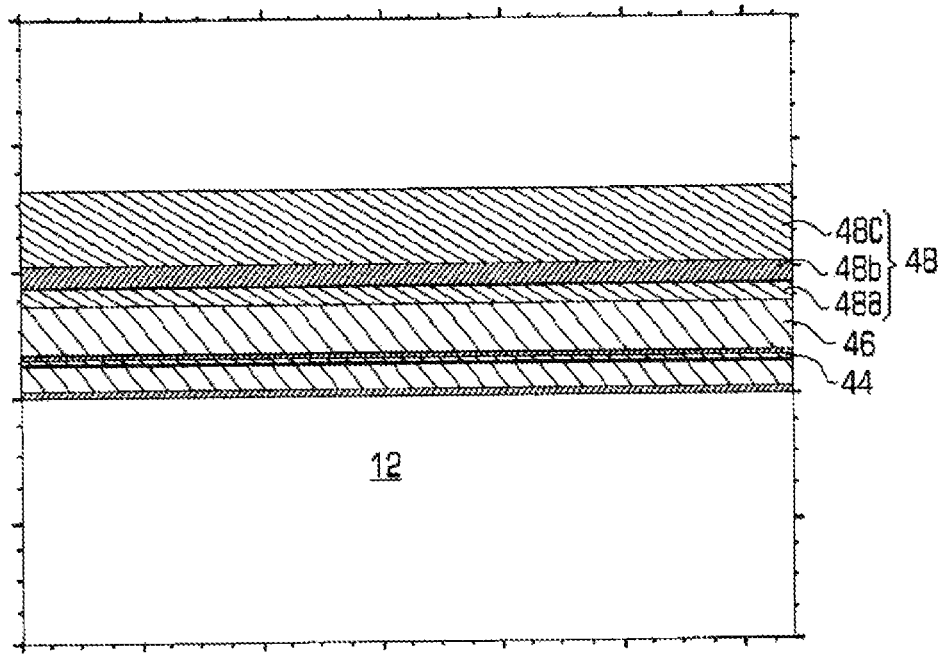

Referring to FIG. 2B, another insulating layer 44, such as silicon dioxide (or even a composite layer, such as ONO) is deposited or formed on the first layer 42 of polysilicon. Depending on whether the material is silicon dioxide or ONO, the layer 44 can be on the order of 100-200 angstroms. A second layer 46 of polysilicon is then deposited or formed on the layer 44. The second layer 46 of polysilicon can be on the order of 500-4000 angstroms thick. Another layer 48 of insulator is deposited or formed on the second layer 46 of polysilicon and used as a hard mask during subsequent dry etching. In a preferred embodiment, the layer 48 is a composite layer, comprising silicon nitride 48a, silicon dioxide 48b, and silicon nitride 48c, where the dimensions can be 200-600 angstroms for layer 48a, 200-600 angstroms for layer 48b, and 500-3000 angstroms for layer 48c.

Figure 2C:
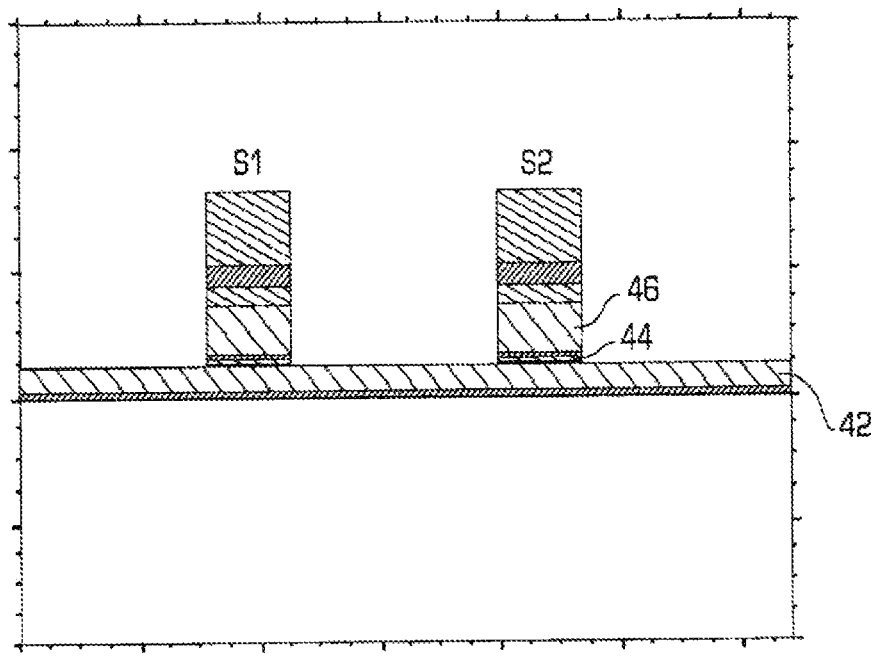

Referring to FIG. 2C, photoresist material (not shown) is deposited on the structure shown in FIG. 2B, and a masking step is formed exposing selected portions of the photoresist material. The photoresist is developed and using the photoresist as a mask, the structure is etched. The composite layer 48, the second layer 46 of polysilicon, the insulating layer 44 are then anisotropically etched, until the first layer 42 of polysilicon is exposed. The resultant structure is shown in FIG. 2C. Although only two "stacks": S1 and S2 are shown, it should be clear that there are number of such "stacks" that are separated from one another.

Figure 2D:
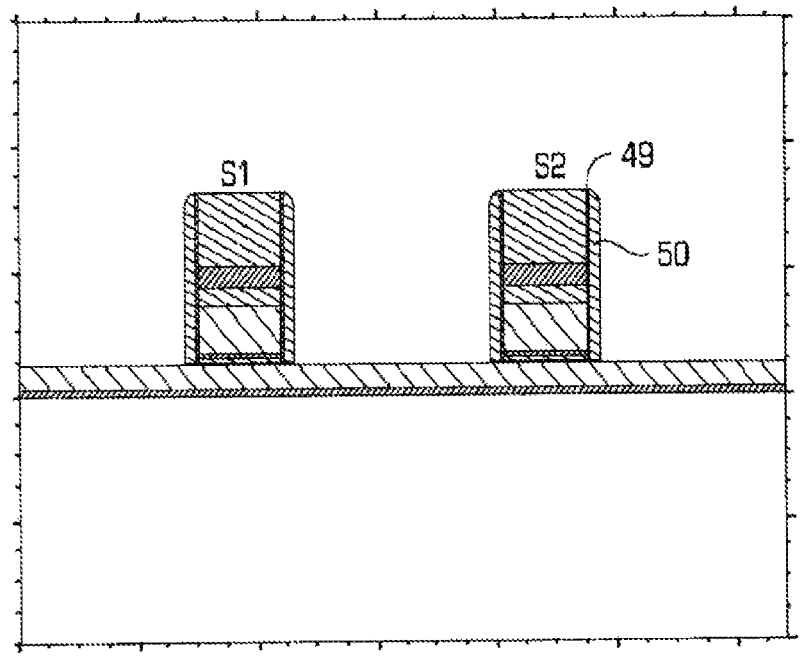

Referring to FIG. 2D, silicon dioxide 49 is deposited or formed on the structure. This is followed by the deposition of silicon nitride layer 50. The silicon dioxide 49 and silicon nitride 50 are anisotropically etched leaving a spacer 51 (which is the combination of the silicon dioxide 49 and silicon nitride 50) around each of the stacks S1 and S2. The resultant structure is shown in FIG. 2D.

Figure 2E:
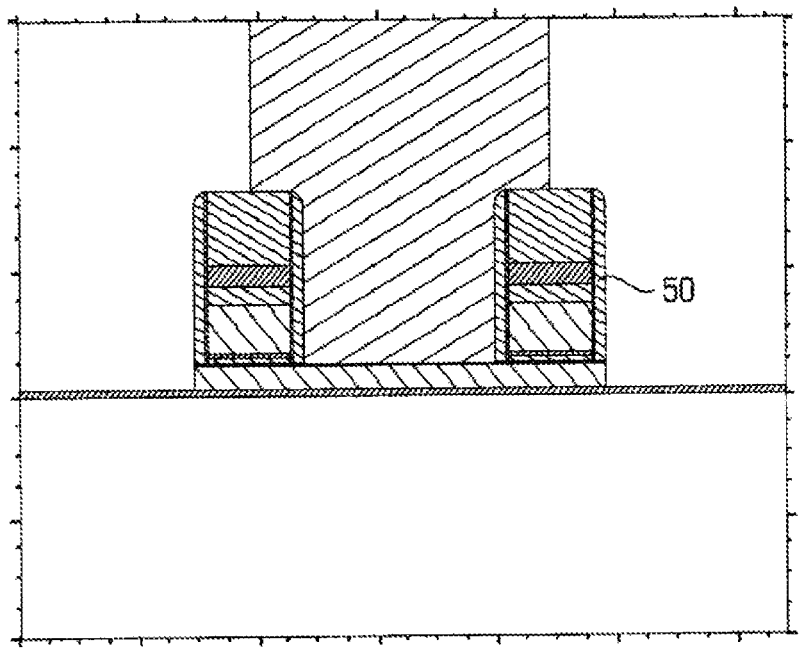

Referring to FIG. 2E, a photoresist mask is formed over the regions between the stacks S1 and S2, and other alternating pair stacks. For the purpose of this discussion, this region between the stacks S1 and S2 will be called the "inner region" and the regions not covered by the photoresist, shall be referred to as the "outer regions". The exposed first polysilicon 42 in the outer regions is anisotropically etched. The oxide layer 40 is similarly anisotropically etched. The resultant structure is shown in FIG. 2E.

Figure 2F:
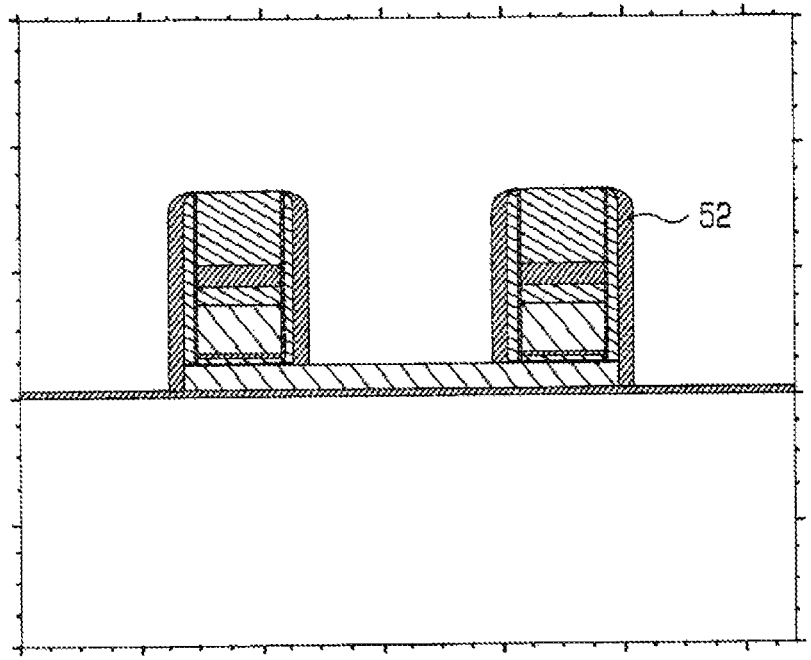

Referring to FIG. 2F, the photoresist material is removed from the structure shown in FIG. 2E. A layer of oxide 52 is then deposited or formed. The oxide layer 52 is then subject to an anisotropical etch leaving spacers 52, adjacent to the stacks S1 and S2. The resultant structure is shown in FIG. 2F.

Figure 2G:
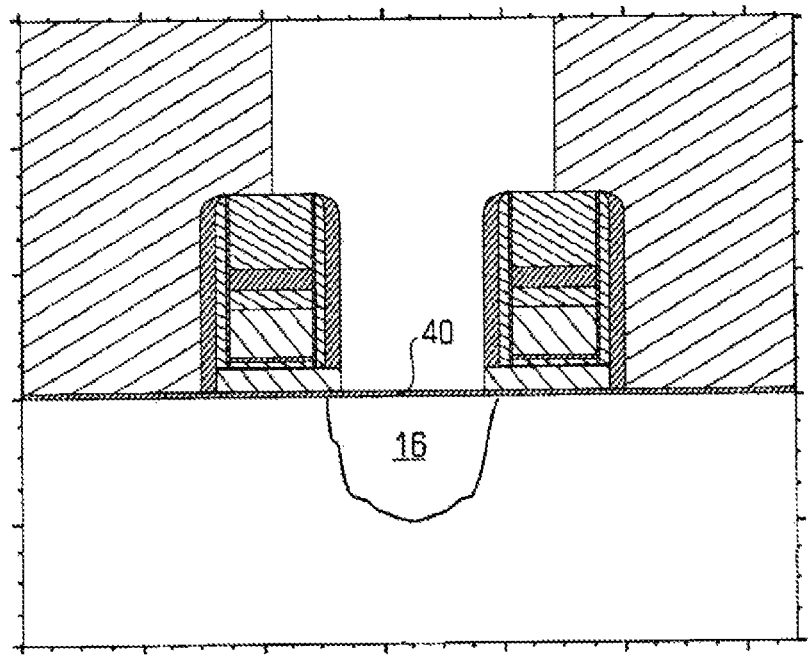

Referring to FIG. 2G, photoresist material is then deposited and is masked leaving openings in the inner regions between the stacks S1 and S2. Again, similar to the drawing shown in FIG. 2E, the photoresist is between other alternating pairs of stacks. The polysilicon 42 in the inner regions between the stacks S1 and S2 (and other alternating pairs of stacks) is anisotropically etched. The silicon dioxide layer 40 beneath the polysilicon 42 may also be anisotropically etched. The resultant structure is subject to a high voltage ion implant forming the regions 16. The resultant structure is shown in FIG. 2G.

Figure 2H:
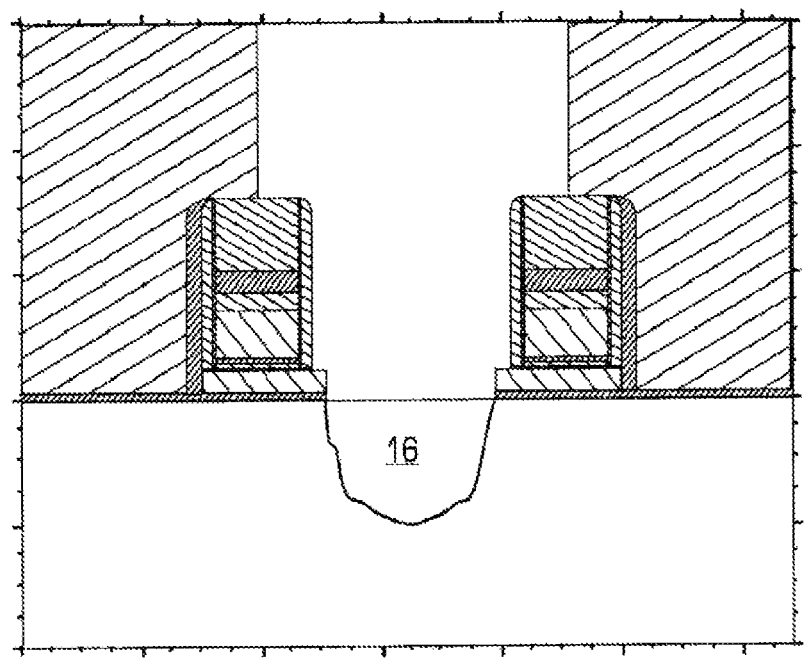
Figure 2I:
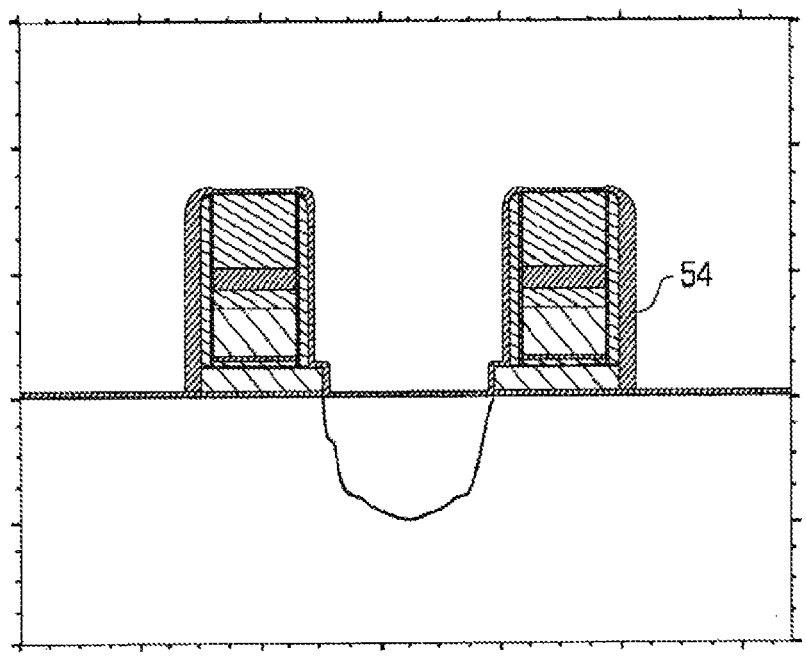

Referring to FIG. 2H, the oxide spacer 52 adjacent to the stacks S1 and S2 in the inner region is removed by e.g. a wet etch or a dry isotropic etch. Referring to FIG. 2I, the photoresist material in the outer regions of the stacks S1 and S2 is removed. Silicon dioxide 54 is deposited or formed everywhere. The resultant structure is shown in FIG. 2I.

Figure 2J:
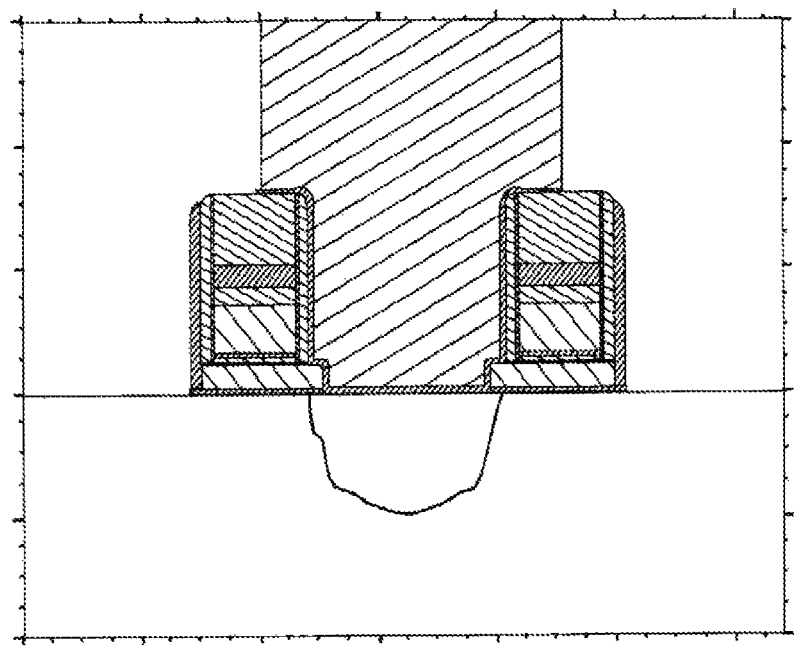

Referring to FIG. 2J, the structure is once again covered by photoresist material and a masking step is performed exposing the outer regions of the stacks S1 and S2 and leaving photoresist material covering the inner region between the stacks S1 and S2. An oxide anisotropical etch is performed, to reduce the thickness of the spacer 54 in the outer regions of the stack S1 and S2, and to completely remove silicon dioxide from the exposed silicon substrate 12 in the outer regions. The resultant structure is shown in FIG. 2J.

Figure 2K:
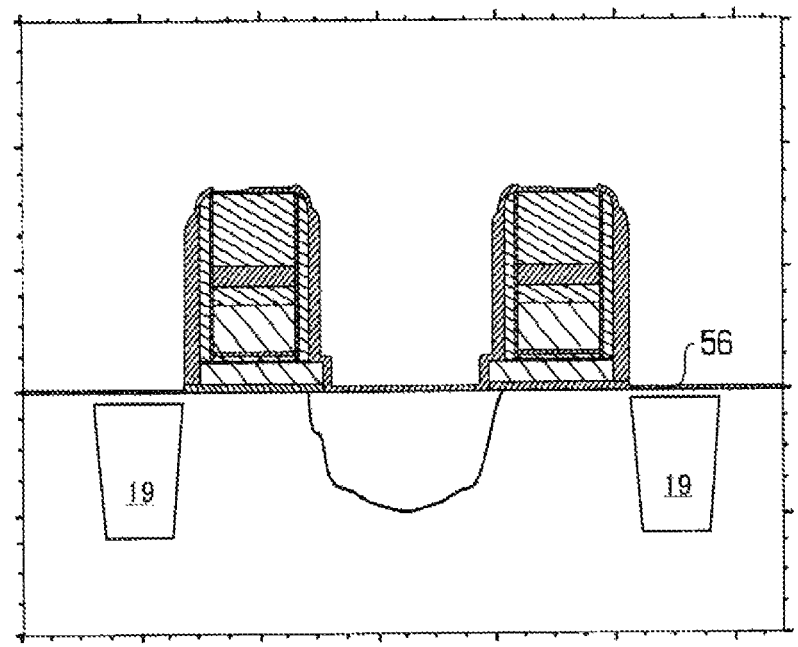

Referring to FIG. 2K, a silicon carbide region is formed by epitaxial growth to form stressor region 19 of embedded silicon carbide in the substrate 12. Before, any WL channel implant (in the WL channel region 18a), a photo lithographic masking process is used to selectively etch silicon from the surface of substrate 12 to form a recess region where silicon carbide layer is intended. Then, a silicon carbide layer with the desired thickness is grown in the recess region by selective epitaxy. Next, a thin layer of Si is deposited via chemical vapor deposition on top of the silicon carbide layer (resulting in strained silicon layer 19*a*). Then, a thin layer 56 of silicon dioxide is formed on the structure. This oxide layer 56 is the gate oxide between the select gate and the substrate 12.

Figure 2L:
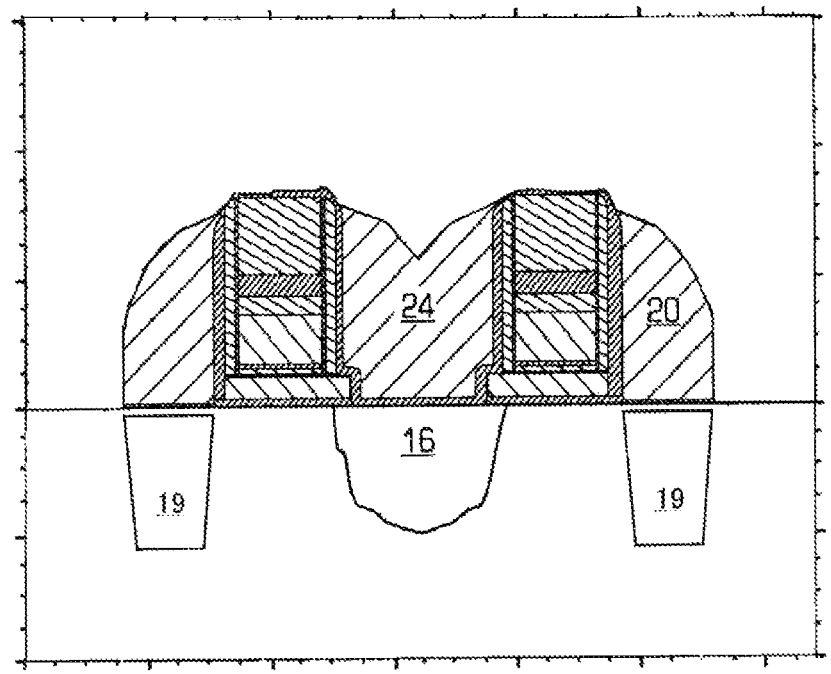

Referring to FIG. 2L, polysilicon is deposited everywhere, which is then subject to an anisotropical etch forming spacers in the outer regions of the stack S1 and S2 which form the select gates 20 of two memory cells 10 adjacent to one another sharing a common region 16. In addition, the spacers within the inner regions of the stacks S1 and S2 are merged together forming a single erase gate 24 which is shared by the two adjacent memory cells 10.

Figure 2M:
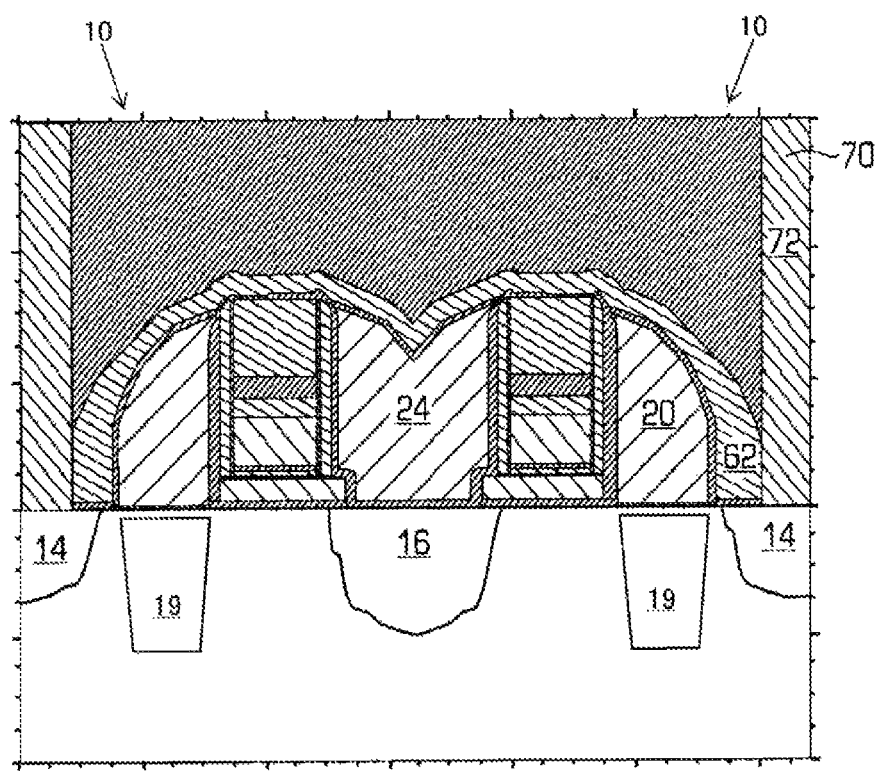

Referring to FIG. 2M, a layer of insulator 62 is deposited on the structure, and etched anisotropically to form spacers 62 next to the select gates 20. Insulator 62 can be a composite layer comprising silicon dioxide and silicon nitride. Thereafter, an ion implant step is performed forming the regions 14. Each of these memory cells on another side share a common region 14. Insulators and metallization layers are subsequently deposited and patterned to form bit line 70 and bit line contacts 72. The operations of program, read and erase and in particular the voltages to be applied may be the same as those as set forth in U.S. Pat. No. 6,747,310, whose disclosure has been incorporated herein by reference in its entirety. The resulting memory cells 10 are illustrated in FIG. 2M.

Figure 3:
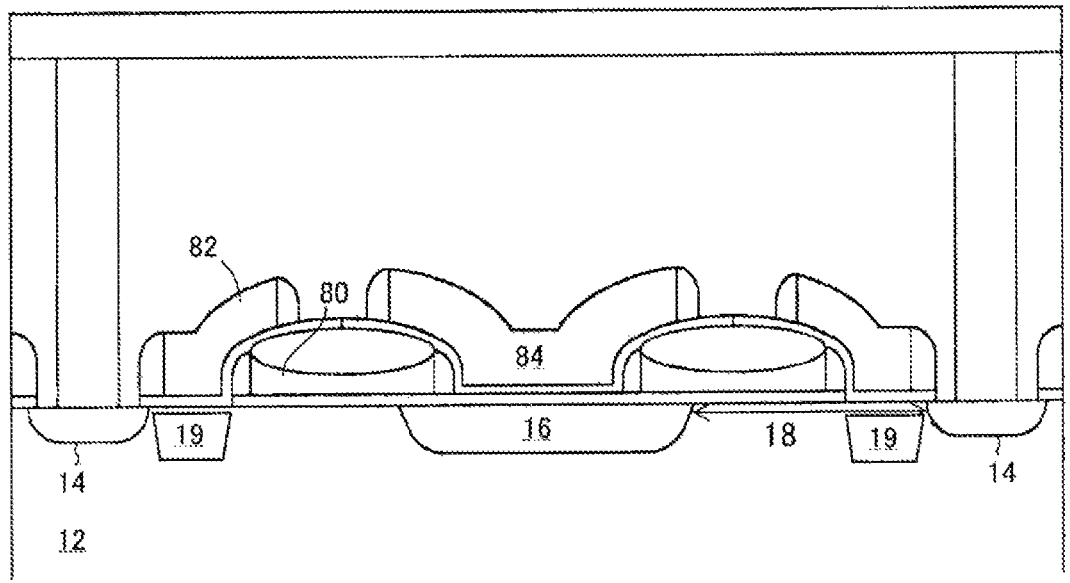
FIG. 3 is a side cross sectional view of a three gate memory cell with the stressor region of the present invention.

The formation of stressor regions 19 in the WL channel can be implemented in other split gate memory cell configurations. For example, U.S. Pat. No. 7,315,056 discloses a split gate memory cell with three gates (a floating gate, a control gate and a program/erase gate), and is incorporated herein by reference in its entirety for all purposes. FIG. 3 illustrates the three gate memory cell modified to include stressor regions 19 in the WL channel. Specifically, this memory cell configuration includes the floating gate 80, control gate 82 laterally adjacent to the floating gate 80 and extending up and over floating 80, and a program/erase gate 84 on the other side of floating gate 80 and extending up and over floating gate 80.

Figure 4:
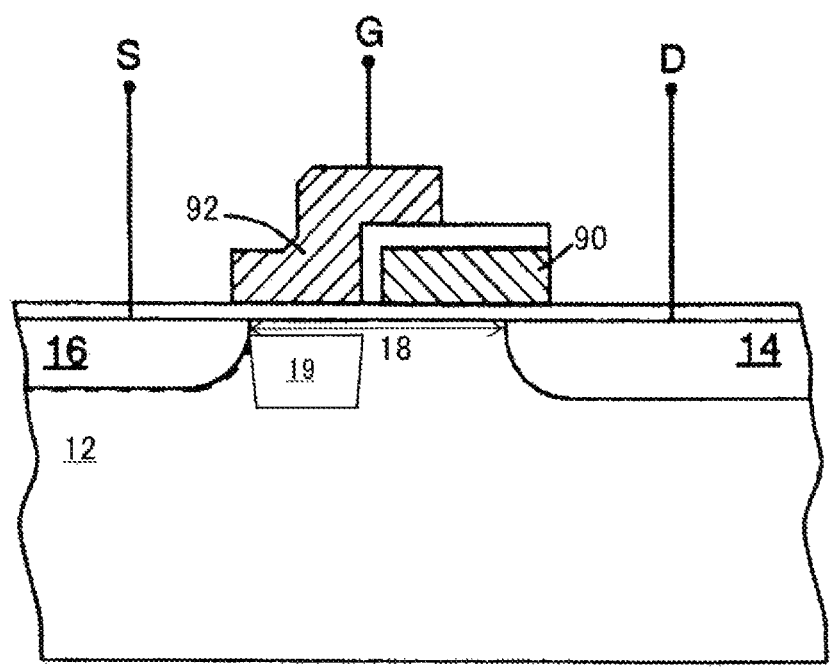
FIG. 4 is a side cross sectional view of a two gate memory cell with the stressor region of the present invention.

U.S. Pat. No. 5,029,130 discloses a split gate memory cell with two gates (a floating gate and a control gate), and is incorporated herein by reference in its entirety for all purposes. FIG. 4 illustrates the two gate memory cell modified to include stressor regions 19 in the FG channel. Specifically, this memory cell configuration includes the floating gate 90 and a control gate 92 laterally adjacent to the floating gate 90 and extending up and over floating 90.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. For example, as is apparent from the claims and specification, not all method steps need be performed in the exact order illustrated or claimed, but rather in any order that allows the proper formation of the memory cell of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A memory device, comprising:
   a substrate of semiconductor material of a first conductivity type;
   first and second spaced-apart regions in the substrate of a second conductivity type, with a channel region in the substrate therebetween;
   a conductive floating gate over and insulated from the substrate, wherein the floating gate is disposed at least partially over the first region and a first portion of the channel region;
   a conductive second gate laterally adjacent to and insulated from the floating gate, wherein the second gate is disposed at least partially over and insulated from a second portion of the channel region; and
   a stressor region of embedded silicon carbide formed in the substrate directly under the second portion of the channel region and the second gate, wherein no stressor region of embedded silicon carbide is formed directly under the first portion of the channel region.

2. The memory device of claim 1, wherein the second gate has a first portion laterally adjacent to and insulated from the floating gate, and a second portion that extends up and over, and insulated from, the floating gate.

3. The memory device of claim 1, further comprising:
   a conductive program/erase gate laterally to one side of, and insulated from, the floating gate, wherein the program/erase gate is disposed at least partially over and insulated from the first region; and
   the second gate is laterally to an opposite side of the one side of, and insulated from, the floating gate.

4. The memory device of claim 1, further comprising:
   a conductive control gate over and insulated from the floating gate;
   a conductive erase gate laterally to one side of, and insulated from, the floating gate, wherein the erase gate is disposed at least partially over and insulated from the first region; and
   the second gate is laterally to an opposite side of the one side of, and insulated from, the floating gate.

5. The memory device of claim 1, wherein the stressor region is disposed directly under a surface of the substrate such that a surface portion of the substrate over the stressor region is a strained silicon layer and forms the channel region second portion.

\* \* \* \* \*